(12) United States Patent
Kasajima et al.

(10) Patent No.: US 10,101,413 B2
(45) Date of Patent: Oct. 16, 2018

(54) MAGNETIC FIELD DETECTION DEVICE

(71) Applicant: TDK CORPORATION, Tokyo (JP)

(72) Inventors: Tamon Kasajima, Tokyo (JP); Kei Tanabe, Tokyo (JP); Akihiro Ogawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 88 days.

(21) Appl. No.: 14/528,231

(22) Filed: Oct. 30, 2014

(65) Prior Publication Data

US 2015/0115938 A1 Apr. 30, 2015

(30) Foreign Application Priority Data

Oct. 30, 2013 (JP) ................................. 2013-225532

(51) Int. Cl.
*G01D 5/22* (2006.01)
*G01R 33/09* (2006.01)
*G01R 33/00* (2006.01)

(52) U.S. Cl.
CPC ......... *G01R 33/09* (2013.01); *G01R 33/0041* (2013.01)

(58) Field of Classification Search
CPC ...... F15B 15/2815; G05B 2219/37019; G05B 2219/37031; G05B 2219/37123; G05B 2219/37133
USPC ........................................................ 324/207
See application file for complete search history.

(56) References Cited

U.S. PATENT DOCUMENTS

| 4,603,365 A * | 7/1986 | Nakamura | B82Y 25/00 324/225 |
|---|---|---|---|
| 5,245,286 A | 9/1993 | Carlson et al. | |
| 2001/0030537 A1* | 10/2001 | Honkura | G01R 33/02 324/249 |
| 2007/0165334 A1* | 7/2007 | Takenaga | B82Y 25/00 360/313 |
| 2010/0219822 A1* | 9/2010 | Suzuki | G01D 1/00 324/252 |
| 2011/0133733 A1 | 6/2011 | Nagasaki et al. | |

(Continued)

FOREIGN PATENT DOCUMENTS

| JP | S58-154615 A | 9/1983 |
|---|---|---|
| JP | 2005321329 A | 11/2005 |

(Continued)

*Primary Examiner* — Son Le
*Assistant Examiner* — Akm Zakaria
(74) *Attorney, Agent, or Firm* — Oliff PLC

(57) ABSTRACT

A magnetic field detection device includes: a first magnetic field generating part, including a first magnetic field generating conductor; a first magnetic field detection part, including a first magnetic field detection element and a first differential operation part, wherein a first output of the first magnetic field detection element corresponding to the environment magnetic field is inputted into the first differential operation part, and a first feedback current flows into the first magnetic field generating conductor, and thus the first magnetic field generating part provides the first magnetic field detection element with a first feedback current magnetic field, with a direction opposite to the environment magnetic field; a second magnetic field generating part, including a second magnetic field generating conductor, in which a second current corresponding to the first feedback current flows; and a second magnetic field detection part, including a second magnetic field detection element.

19 Claims, 3 Drawing Sheets

(56) References Cited

U.S. PATENT DOCUMENTS

2013/0127456 A1* 5/2013 Hebiguchi ........... G01R 15/205
324/252
2014/0055139 A1* 2/2014 Takegoshi .............. G01R 33/30
324/322

FOREIGN PATENT DOCUMENTS

| JP | 2009297224 A | 12/2009 |
| JP | 2009300331 A | 12/2009 |
| JP | 2012152515 A | 8/2012 |

\* cited by examiner

MAGNETIC FIELD DETECTION DEVICE

The present invention relates to a magnetic field detection device which can detect a minimal magnetic field and the like.

BACKGROUND

Recently, the needs for detecting a weak magnetic field such as detecting the bio-magnetic field, flaw detection, non-destructive detection or the like are increasing.

When detecting a minimal magnetic field, since the influence of environment magnetic field, such as earth magnetism entering into the detecting target or magnetic field produced from detection device, becomes trouble, various technical solutions to cancel the environment magnet field have been provided.

According to Patent Document 1 (JP2009-297224A), an environment magnetic field detection sensor and a detection sensor are placed in the several coils, which are set to reduce the influence of the environment magnetic field, so that the environment magnetic field is eliminated while the magnetic field of the detection object is measured.

According to Patent Document 2 (JP2012-152515A), the difference, between the output of a magnetic sensor containing the environment magnetic field and the magnetic field of the detection object and that of the magnetic sensor whose environment magnetic field is only detected, is obtained through calculation, and thus elimination of the environment magnetic field is realized and the detection magnetic field of the object is outputted. Here, differential operation of a pair of differential operation part, that is to detect the environment magnetic field and the magnetic field of the detection object respectively, and differential operation of the output of a pair of the differential operation part is conducted, and thus three circuits are needed in the differential operation circuit.

In addition, generally speaking, there is a problem of the so-called temperature drift, which is caused by fluctuation of the output of the magnetic sensor resulted from the change of the environment temperature of the magnetic sensor that detects the environment magnetic field. Especially, in the case of using a magnetoresistance element in the magnetic field detection element, output variation (temperature drift) of the magnetic sensor is easily caused by the change of the environment temperature. It is caused by resistance changes of the magnetoresistance element resulted from the change of the temperature.

PATENT DOCUMENTS

Patent Document 1: JP2009-297224A
Patent Document 2: JP2012-152515A

SUMMARY

In the way of obtaining differences through operation in Patent Document 2, the electrical operation circuit, especially several differential operation parts, is essential, and it is disadvantageous for cost or miniaturization of the sensor part.

Therefore, the present invention aims to reduce of the parts number of the differential operation part and miniaturization.

In order to achieve the above-mentioned purpose, the magnetic field detection device according to the present invention comprises a first magnetic field generating part, comprising a first magnetic field generating conductor; a first magnetic field detection part, comprising a first magnetic field detection element and a first differential operation part, wherein a first output of the first magnetic field detection element corresponding to the environment magnetic field is inputted into the first differential operation part, and a first feedback current flows into the first magnetic field generating conductor, and thus the first magnetic field generating part provides the first magnetic field detection element with a first feedback current magnetic field, with a direction opposite to the environment magnetic field; a second magnetic field generating part, comprising a second magnetic field generating conductor, in which a second current corresponding to the first feedback current flows; and a second magnetic field detection part, comprising a second magnetic field detection element, wherein, the second magnetic field generating part provides the second magnetic field detection element with a magnetic field corresponding to the second current, with a direction opposite to the environment magnetic field, and a detection magnetic field is detected by the second magnetic field detection part.

According to the present invention, since the operation of the sensor output to exclude the environment magnetic field is not needed, it becomes possible to decrease the parts number of the differential operation part and miniaturize. Further, variation (temperature drift) of the output of the magnetic field detection part for detecting the magnetic field caused by environment temperature can be inhibited.

In addition, in the present invention, the following magnetic field detection device can be obtained, wherein the magnetic field generated by first magnetic field generating conductor is parallel to that generated by the second magnetic field generating conductor, and the first magnetic field detection element is placed in parallel with the second magnetic field detection element.

According to the present invention, the magnetic field generated by the first magnetic field generating conductor and that generated by the second magnetic field generating conductor are regarded as the equal magnetic field.

Moreover, in the present invention, the following magnetic field detection device can be obtained, wherein the first magnetic field generating conductor is a first solenoid coil which is disposed separately from the first magnetic field detection element, wherein, the second magnetic field generating conductor is a second solenoid coil which is disposed separately from the second magnetic field detection element, wherein, the first magnetic field detection element is disposed in the inside of the first solenoid coil, wherein, the second magnetic field detection element is disposed in the inside of the second solenoid coil, wherein, the first magnetic field detection element is disposed in parallel with the second magnetic field detection element, and the center line of the first solenoid coil is parallel to that of the second solenoid coil.

According to the present invention, as the first and the second solenoidal coils are separately placed, the design becomes easy compared to integral of the solenoidal coils.

Further, in the present invention, the following magnetic field detection device can be obtained, wherein the second magnetic field generating part comprises a third magnetic field generating conductor, wherein, the second magnetic field detection part comprises a second differential operation part, wherein a second output of the second magnetic field detection element corresponding to the detection magnetic field is inputted into the second differential operation part, and a second feedback current flows into the second magnetic field generating part, and thus the second magnetic field generating part provides the second magnetic field detection element with a magnetic field, with a direction opposite to the detection magnetic field, wherein, the second magnetic field generating part generates a second current magnetic field and a second feedback current magnetic field, wherein the second current magnetic field is corresponding to the second current that flows in the second magnetic field generating conductor, and the second feedback current magnetic field is corresponding to the second feedback current that flows in the third magnetic field generating conductor.

According to the present invention, variation (temperature drift) of the output of the magnetic field detection part (the second magnetic field detection part) for detecting the magnetic field caused by the changes of environment temperature can be inhibited. In addition, as the second feedback current magnetic field (whose direction is opposite to that of the detection magnetic field) is generated in the second magnetic field generating part, the operation area of the second magnetic field detection element is restricted, and linearity of the output voltage can be improved because of inhibiting variation caused by the temperature of the resistance of the second magnetic field detection element.

Further, in the present invention, the following magnetic field detection device can be obtained, wherein the second magnetic field detection part comprises a second differential operation part, wherein a second output of the second magnetic field detection element corresponding to the detection magnetic field is inputted into the second differential operation part, and a second feedback current flows into the second magnetic field generating part, and thus the second magnetic field generating part providing the second magnetic field detection element with a magnetic field, with a direction opposite to the detection magnetic field, wherein, the second magnetic field generating part generates magnetic fields that are corresponding to the second current and the second feedback current, in which the second current flows in the second magnetic field generating conductor.

According to the present invention, as the second magnetic field generating part generates the second current flowing into the second magnetic field generating conductor and the magnetic field corresponding to the second feedback current, the number of the parts can be decreased.

In addition, the first and the second magnetic field detection element can be the magnetoresistance element.

Since the differential operation of the sensor output to exclude the environment magnetic field is not needed, reduce of the parts number of the differential operation part and miniaturization can be realized.

DETAILED DESCRIPTION OF EMBODIMENTS

Figure 3:
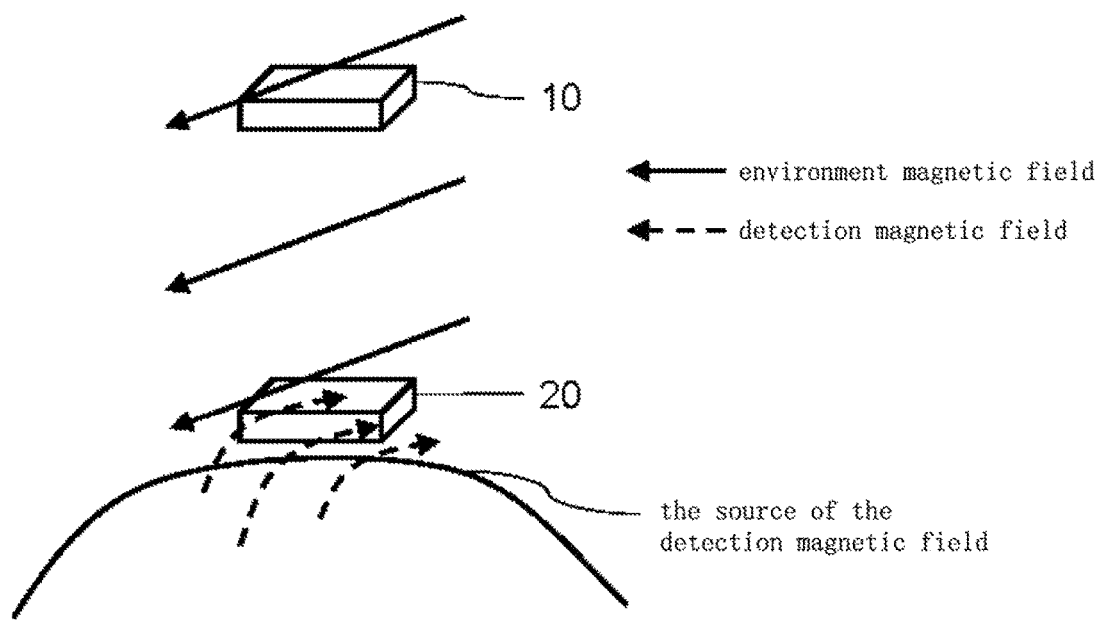
FIG. 3 is a pattern drawing showing the relation between the magnetic field and the embodiment which is to carry out the present invention.

FIG. 3 is a pattern drawing showing the relation among the first magnetic field detection element 10, the second magnetic field detection element 20, environment magnetic field and detection magnetic field which are bases to carry out the present invention. The first magnetic field detection element 10 is placed where only environment magnetic field is detected. The second magnetic field detection element 20 is placed where the detection magnetic field can be detected, and shows magnetism-sensitive properties in both environment magnetic field and detection magnetic field. That is, the second magnetic field detection element 20 is placed near the source of the detection magnetic field. Here, in the second magnetic field detection element 20, in order that only the detection magnetic field is detected, it is essential to reduce the detection value caused by the environment magnetic field. As the environment magnetic field is usually uniform, the detection value of the first magnetic field detection element 10, which responds to the environment magnetic field, is regarded to be equal to that corresponding to the environment magnetic field of the second magnetic field detection element 20. Thus, by applying the magnetic filed corresponding to the detection value of the first magnetic field detection element 10 in opposite direction relative to the environment magnetic field of the second magnetic field detection element 20, the detection magnetic field can be measured on the condition of reducing the influence of the environment magnetic field in the second magnetic field detection element 20. Further, the detection magnetic field can be direct-current field or alternating-current field here. Moreover, the opposite direction relative to the environment magnetic field refers to the direction of the different sign to reduce the detection value corresponding to the environment magnetic field of the first magnetic field detection element 10 and the second magnetic field detection element 20. In the following description, the opposite direction refers to the same meaning. Further, it can be applied, in the same way, for the magnetic field detection element except the first magnetic field detection element 10 and the second magnetic field detection element 20.

Hereinafter, the preferred embodiments of the present invention are illustrated while making a reference to the drawings. Further, the present invention will not be limited to the following embodiments. Moreover, the constituent elements shown in the following description include those easily thought of by those skilled in the art, and those substantially the same. Besides, the constituent elements disclosed in the following description can be appropriately combined. In addition, drawings are illustrative. In order to describe conveniently, the relation between thickness and plane size, and the thickness ratio among devices can be different from the actual sensor structure in the scope of be capable of obtaining the effect of the present embodiment.

Embodiment 1

Figure 1:
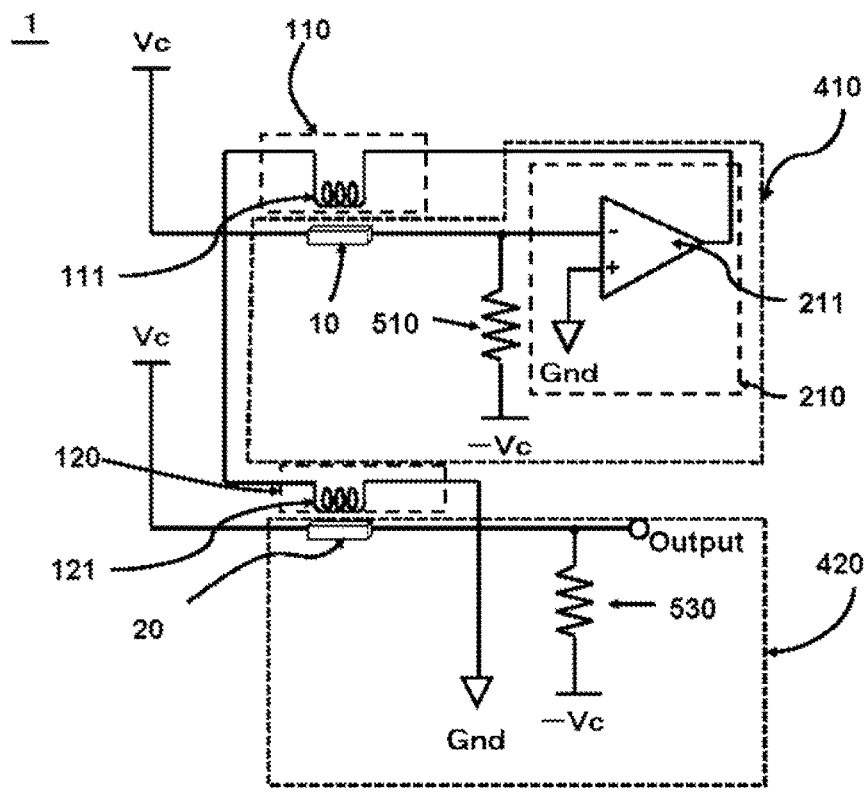
FIG. 1 is a schematic drawing of the magnetic field detection device of the embodiment 1.

FIG. 1 is a brief drawing of the magnetic field detection device 1 of the present embodiment 1. The magnetic field detection device 1 include the first magnetic field generating conductor 111 which is contained in the first magnetic field generating part 110, the first magnetic field detection element 10, the first differential operation circuit 211 which is contained in the first differential operation part 210, the first resistance 510, the second magnetic field generating conductor 121 which is contained in the second magnetic field generating part 120, the second magnetic field detection element 20, and the detection resistance 530. Here, the first magnetic field detection part 410 consists of the first magnetic field detection element 10, the first differential operation part 210 and the first resistance 510, and the second magnetic field detection part 420 consists of the second magnetic field detection element 20 and the detection resistance 530.

One end of the first magnetic field generating conductor 111 contained in the first magnetic field generating part 110 is connected with the output end of the first differential operation circuit 211 included in the first differential operation part 210. One input end of the pair of input ends of the first differential operation circuit 211 is connected with the other end of the first magnetic field detection element 10, one end of which is connected to the first potential (Vc). The other input end of the pair of the first differential operation circuit 211 is connected with the third potential (Gnd). The other end of the first magnetic field detection element 10 is connected with the other end of the first resistance 510, one end of which is connected to the second potential (−Vc). The other end of the first magnetic field generating conductor 111 is connected with one end of the second magnetic field generating conductor 121 included in the second magnetic field generating part 120. The other end of the second magnetic field generating conductor 121 is connected to the third potential (Gnd). One end of the second magnetic field detection element 20 is connected to the first potential (Vc) and the other end is connected with one end of the detection resistance 530. The other end of the detection resistance 530 is connected with the second potential (−Vc). Here, the other end of the first magnetic field detection element 10 outputs the first output, and the other end of the second magnetic field detection element 20 outputs the second output.

The first output of the first magnetic field detection element 10 that is placed near the first magnetic field generating conductor 111 included in the first magnetic field generating part 110 is inputted into the input end of the first differential operation part 210 included in the first magnetic field detection part 410. The first feedback current that is the output of the first differential operation part 210 flows into the first magnetic field generating conductor 111 included in the first magnetic field generating part 110 in the way of decreasing the changes of the first output, and the first magnetic field generating conductor 111 generates the first feedback current magnetic field whose direction is opposite to the environment magnetic field. That is, in the case of applying approximately uniform environment magnetic field such as earth magnetism or environment magnetic field to the first magnetic field detection element 10, the first differential operation part 210 included in the first magnetic field detection part 410 operates so that the first feedback current flows from the first differential operation part 210 to the first magnetic field generating 111 in the way of reducing its environment magnetic field, and operation is performed in the way of applying the first feedback current magnetic field with the direction opposite to environment magnetic field to the first magnetic field detection element 10. Therefore, the influence of environment magnetic field is reduced by the first feedback current magnetic field caused by the first feedback current and the direction of the first feedback current magnetic field is opposite to environment magnetic field, and thus the changes of the first output of the first magnetic field detection element 10 are decreased. That is, the first magnetic field generating part 110 generates the first feedback current magnetic field whose direction is opposite to environment magnetic field by the first feedback current corresponding to the environment magnetic field. Hereinafter, the first magnetic field generating part 110 and the first magnetic field detection part 410 are described.

The first magnetic field generating part 110 includes the first magnetic field generating conductor 111. If the first magnetic field generating conductor 111 is to apply the first feedback current magnetic field (with the opposite direction to environment magnetic field) generated by the first feedback current to the first magnetic field detection element 10, its shape and material are not particularly limited. For example, if the first magnetic field detection element 10 is with the shape extending along one direction, the first magnetic field generating conductor 111 can be a conductor with straight shape, and it also can be a solenoid-shaped conductor winding the first magnetic field detection element 10. In addition, the first magnetic field generating conductor 111 can be insulated to the first magnetic field detection element 10 and can be formed integrally with the first magnetic field detection element 10, or the first magnetic field generating conductor 111 can be placed separately from the first magnetic field detection element 10 to form into a solenoid-shaped or a straight-shaped by surrounding the first magnetic field detection element 10. Further, the first magnetic field generating part 110 can be the structure in which one end of the first magnetic field generating conductor 111 is connected with the output end of the first differential operation part 210, and it also can be the structure in which one end of the first magnetic field generating conductor 111 is connected with the other end (non-control end) of the first field-effect transistor (not shown), one end of the non-control end of which is connected to the first potential (Vc) and the output of the first differential operation part 210 is connected to the control end of the first field-effect transistor (not shown). In the case that one end of the first magnetic field generating conductor 111 is connected to the output end of the first differential operation part 210, the output from the output end of the first differential operation part 210 becomes the first feedback current. In the case that the output of the first differential operation part 210 is connected to the control end of the first field-effect transistor (not shown), the output from the output end of the first differential operation part 210 controls the control end of the field-effect transistor (not shown), and the current, which responds to the signal of the control end, flowing to the first magnetic field generating conductor 111 connecting to the other end of the non-control end becomes the first feedback current. In addition, a bipolar transistor, a static induction transistor or the like can be used to replace the first field-effect transistor (not shown).

The first differential operation part 210 included in the first magnetic field detection part 410 has the first differential operation circuit 211. The first output i.e., the output of the first magnetic field detection element 10 is inputted to one input end of a pair input ends of the first differential operation circuit 211 and the other input end is connected to the third potential (Gnd). Further, when the third magnetic field detection element (not shown) exists, the other input end of the first differential operation circuit 211 inputs the other end of the third magnetic field detection element (not shown) and the other end of the third resistance (not shown), one end of which is connected to the second potential (−Vc). In addition, the following structure also can be formed in the way that the first output of the first magnetic field detection element 10 is inputted into one input end of a pair input ends of the first differential operation circuit 211, the other input end is connected to the third potential (Gnd), the outputs of the first differential operation circuit 211 and the second differential operation circuit (not shown) are respectively inputted into a pair input ends of the third differential operation circuit (not shown), and the output of the third differential operation circuit (not shown) is operated in the way of flowing the first feedback current into the first magnetic field generating part 110. Further, the signs of the change rate of the resistances of the first magnetic field detection element 10 (applied with environment magnetic field) and the third magnetic field detection element (not shown) are preferably different. By make the signs of of the change rate of the resistances being different, the output of the first differential operation part 210 can be increased and detection accuracy of environment magnetic field can be improved.

The first magnetic field detection part 410 includes the first magnetic field detection element 10, and it is placed where the first feedback current magnetic field (whose direction is opposite to environment magnetic field) caused by the first feedback current affects. In addition, the first magnetic field detection part 410 also can include the third to the fifth magnetic field detection element (not shown). Here, the first magnetic field detection element 10 and the third to the fifth magnetic field detection element (not shown) are placed where the first feedback current magnetic field (whose direction is opposite to that of the environment magnetic field) caused by the first feedback current affects, which is generated by the first magnetic field generating part 110. In this case, the first connection point connecting the first magnetic field detection element 10 with the third magnetic field detection element (not shown) and the second connection point connecting the fourth magnetic field detection element (not shown) with the fifth magnetic field detection element (not shown) can be connected to a pair of input ends of the first differential operation part 210 respectively. Thus, in the case of using the so-called full bridge connection of the first magnetic field detection element 10 and the third to the fifth magnetic field detection element (not shown), the first differential operation part 210 operates in the way of decreasing the environment magnetic field, i.e., the potential difference between the first connection point and the second connection point is 0. That is, the first differential operation part 210 operates in the way of flowing the first feedback current into the first magnetic field generating conductor 111. Therefore, the first magnetic field detection element 10 and the third to the fifth magnetic field detection elements (not shown) are applied with the first feedback current magnetic field, with direction opposite to the environment magnetic field, caused by the first feedback current so that the environment magnetic field can be reduced. Further, the first magnetic field detection element 10 and the third to the fifth magnetic field detection elements (not shown) are preferred to be integrally formed. In addition, one to three magnetic field detection elements in the third to the fifth magnetic field detection elements (not shown) also can be used as the resistance. Further, examples of the first magnetic field detection element 10 and the third to the fifth magnetic field detection elements (not shown) include magnetoresistive element such as AM (aeolotropic) magnetoresistive element, S-V (spin-valve) huge magnetoresistive element, tunnel magnetoresistive element, hall element etc.

Here, as shown in FIG. 1, in the case that the other end of the first magnetic field detection element 10, one end of which connects to the first potential (Vc), is connected to the other end of the first resistance 510, one end of which connects to the second potential (−Vc), the first output outputted from the other end of the first magnetic field detection element 10 and the third potential (Gnd) are respectively inputted into the input end of the first differential operation part 210. The output end of the first differential operation part 210 is inputted into one end of the first magnetic field generating conductor 111 included in the first magnetic field generating part 110, and the other end of the first magnetic field generating conductor 11 is connected to the other end of the second magnetic field generating conductor 121, one end of which connects to the third potential (Gnd). The first magnetic field detection element 10 placed near the first magnetic field generating conductor 111 is affected by the environment magnetic field, and the first feedback current magnetic field with opposite direction to the environment magnetic field caused by the first feedback current is applied to the first magnetic filed detection element 10 in the way of reducing the changes of its output (i.e., the first output). That is, the first feedback current magnetic field and the second current magnetic field are respectively applied to the first and the second magnetic field detection element (10, 20), and thus the resistance change ΔR of the first and the second magnetic field detection element (10, 20) caused by the environment magnetic field of the first and the second magnetic field detection element (10, 20) is controlled in the way of being 0 relative to the same environment magnetic field. And, the first feedback current magnetic field with opposite direction to the environment magnetic field is caused by the first feedback current which is to reduce the environment magnetic field, and the second magnetic field with opposite direction to the environment magnetic field is caused by the second current that flows to the second magnetic field generating conductor 121. Further, since the other end of the first magnetic field generating conductor 111 is connected to the other end of the second magnetic field generating conductor 121, one end of which is connected to the third potential (Gnd), the first feedback current is the same as the second current. As ΔR is 0, there is almost no temperature change of ΔR, so the output fluctuation (temperature drift) resulted from the temperature of ΔR of the environment magnetic field can be reduced. Especially, when the first and the second magnetic field detection elements (10, 20) are magnetoresistive elements such as AM magnetoresistive element, S-V huge magnetoresistive element, tunnel magnetoresistive element and the like, it is important to reduce the output fluctuation (temperature drift) because the change of the resistance value of the magnetoresistive element is great due to temperature.

Further, the second potential is described as −Vc, and the third potential is described as Gnd, and they are not limited to this. And the second potential can be regarded as Gnd and the third potential can be regarded as Vc/2.

When the environment magnetic field is approximately 0, the first resistance 510 and the resistance value of the first magnetic field detection element 10 are preferably the same, and the resistance values of the first magnetic field detection element 10 and the third to the fifth magnetic field detection elements (not shown) are preferably the same.

The second magnetic field detection part 420 includes the second magnetic field detection element 20 and the detection resistance 530. Therefore, the second magnetic field detection element 20 can measure the detection magnetic field generated near the second magnetic field detection element 20. Further, detection magnetic field refers to the magnetic field on which the first magnetic field detection element 10 do not directly apply influence. Hence, the first magnetic field detection part 410 and the second magnetic field detection part 420 are separately placed in order not to get the influence of the detection magnetic field. In addition, the second magnetic field generating part 120 is placed near the second magnetic field detection element 20. The second current flows into the second magnetic field generating part 120 corresponding to the first feedback current, and the second magnetic field generating part generates the second current magnetic field with a opposite direction to the environment magnetic field. That is, the direction of the second current magnetic field generated by the second magnetic field generating part 120 is opposite to the environment magnetic field, the second current magnetic field which is to reduce the influence of the environment magnetic field is corresponding to the first feedback current. Therefore, the second magnetic field detection element 20 can measure detection magnetic field on the condition of reducing the effect of the environment magnetic field. Hereinafter, the second magnetic field generating part 120 and the second magnetic field detection part 420 are described.

The second magnetic field generating part 120 includes the second magnetic field generating conductor 121. If the second magnetic field generating conductor 121 is to apply the second current magnetic field, with a opposite direction to the environment magnetic field generated by the second current, to the second magnetic field detection element 20, its shape and material are not particularly limited. For example, if the second magnetic field detection element 20 is with the shape extending along one direction, the second magnetic field generating conductor 121 can be a conductor with straight shape, and it also can be a solenoid-shaped conductor. In addition, the second magnetic field generating conductor 121 can be insulated to the second magnetic field detection element 20 and can be formed integrally with the second magnetic field detection element 20, or the second magnetic field generating conductor 121 can be placed separately from the second magnetic field detection element 20 to form into a solenoid-shaped or a straight-shaped by surrounding the second magnetic field detection element 20. Further, the second magnetic field generating part 120 can be the structure in which one end of the second magnetic field generating conductor 121 is connected with the end of the first magnetic field generating conductor 111 by means of a conductor, and it also can be the structure in which one end of the second magnetic field generating conductor 121 is connected with the other end of the second field-effect transistor (not shown), one end of the non-control end of which is connected with the first potential (Vc) and the output end of the first magnetic field generating part 110 (i.e., the output end of the first magnetic field generating conductor 111) is connected to the control end of the second field-effect transistor (not shown). Further, in the case of being the structure in which one end of the second magnetic field generating conductor 121 is connected to the end of the first magnetic field generating conductor 111 by means of the conductor, the first feedback current is equal to the second current. In the case that the output end of the first magnetic field generating part 110 (i.e., the output end of the first magnetic field conductor 111) is connected to the control end of the second field-effect transistor (not shown), the output from the output end of the first magnetic field generating part 110 controls the control end of the second field-effect transistor (not shown), and the current, which responds to the signal of the control end, flowing to the second magnetic field generating conductor 121 connecting to the other end of the non-control end becomes the second current. In addition, a bipolar transistor, a static induction transistor or the like can be used to replace the second field-effect transistor (not shown). Further, in order to make the first feedback current magnetic field, with a opposite direction to environment magnetic field generated by the first magnetic field generating part 110 which is caused by the first feedback current, and the second current magnetic field, with a opposite direction to environment magnetic field generated by the second magnetic field generating part 120 which is caused by the second current, to be equal magnetic field, the same structure as the first magnetic field generating part 110 is preferably applied to the second magnetic field generating part 120. Especially, the same structure is preferably applied for the first magnetic field generating conductor 111 and the second magnetic field generating conductor 121. In addition, the magnetic field generated by the first magnetic field generating conductor 111 is preferably parallel to that generated by the second magnetic field generating conductor 121.

The second magnetic field detection part 420 includes the second magnetic field detection element 20, and it is placed where the second current magnetic field affects. In addition, the second magnetic field detection part 420 also can include the sixth to the eighth magnetic field detection elements (not shown). Here, the second magnetic field detection element 20 and the sixth to the eighth magnetic field detection elements (not shown) are placed where the second current magnetic field generated by the second magnetic field generating part 120 affects. In this case, the third connection point connecting the second magnetic field detection element 20 to the sixth magnetic field detection element (not shown) and the fourth connection point connecting the seventh magnetic field detection element (not shown) to the eighth magnetic field detection element (not shown) can be connected to a pair of input ends of the third differential operation part (not shown) respectively. Thus, in the case of using the so-called full bridge connection of the second magnetic field detection element 20 and the sixth to the eighth magnetic field detection element (not shown), the detection magnetic field can be measured from the potential difference between the third connection point and the fourth connection point. In addition, the output also can be enhanced through full bridge connection. Moreover, the magnetic field generated near the second magnetic field detection part 420 become a magnetic field with a combination of environment magnetic field and the second current magnetic field, and it is obvious that the influence of the environment magnetic field can be reduced. Hence, the second magnetic field detection element 20 and the sixth to the eighth magnetoresistive elements (not shown) can detect the magnetic field on the condition of reducing the influence of the environment magnetic field. Further, the second magnetic field detection element 20 and the sixth to the eighth magnetic field detection elements (not shown) are preferred to be integrally formed. In addition, one to three magnetic field detection elements in the sixth to the eighth magnetic field detection elements (not shown) also can be seen as the resistance. Further, examples of the second magnetic field detection element 20 and the sixth to the eighth magnetic field detection elements (not shown) include magnetoresistive element such as AM magnetoresistive element, S-V huge magnetoresistive element, tunnel magnetoresistive element, and hall element etc. Further, in order to be affected by the equal magnetic field relative to the first feedback current magnetic field generated by the first feedback current and the second current magnetic field generated by the second current (wherein, the first feedback current magnetic field and the second current magnetic field have the opposite direction to the environment magnetic field), it is preferable that the first magnetic field detection part 410 and the second magnetic field detection part 420 have the same structure. Especially, the same structure is used for the first magnetic field detection element 10 and the second magnetic field detection element 20. It is the same when there are several magnetic field detection elements. The second magnetic field detection part 420 is preferable to be the same structure and configuration as the first magnetic field detection part 410. In addition, the second magnetic field detection part 420 is preferably assigned to be parallel to the first magnetic field detection part 410.

The second magnetic field detection part 420 can include the third differential operation part (not shown), and the seventh differential operation circuit (not shown) can be included in the third differential operation part (not shown). Here, the second output i.e., the output of the second magnetic field detection element 20 is inputted into one input end of a pair input ends of the seventh differential operation circuit (not shown) and the other end is connected to the third potential (Gnd). Further, when there is the sixth magnetic field detection element (not shown), the other input end of the seventh differential operation circuit (not shown) also can be connected to the connection end connecting the other end of the sixth magnetic field detection element (not shown) with the other end of the fourth resistance (not shown), one end of which is connected to the second potential (−Vc). In addition, the second output i.e. the output of the second magnetic field detection element 20 is inputted into one input end of a pair input ends of the seventh differential operation circuit (not shown), and the other input end is connected to the third potential (Gnd). One input end of a pair input ends of the eighth differential operation circuit (not shown) is connected to the connection end connecting the other end of the sixth magnetic field detection element (not shown) and the other end of the fourth resistance, one end of which is connected to the second potential (−Vc), and the other input end is connected to the third potential (Gnd). The outputs of the seventh differential operation circuit (not shown) and the eighth differential operation circuit (not shown) are respectively inputted into a pair of input ends of the ninth differential operation circuit (not shown). The output of the ninth differential operation circuit (not shown) also can be seen as the output of the third differential operation part (not shown). Further, the signs of the change rates of the resistance values of the second magnetic field detection element 20 (applied with environment magnetic field) and the sixth magnetic field detection element (not shown) are preferably different. By making the signs of change rates of the resistance values different, the output of the third differential operation part (not shown) can be increased and detection accuracy of environment magnetic field can be improved.

Here, as shown in FIG. 1, the other end of the second magnetic field detection element 20, one end of which is connected to the first potential (Vc), is connected to the other end of the detection resistance 530, one end of which is connected to the second potential (−Vc). Therefore, the output corresponding to the detection magnetic field can be obtained from the other end of the detection resistance 530. In addition, when there is the third differential operation part (not shown), the output of the third differential operation part (not shown) becomes the output corresponding to the detection magnetic field.

Further, the second potential is described as −Vc, and the third potential is described as Gnd, and they are not limited.

And the second potential can be regarded as Gnd and the third potential can be regarded as Vc/2.

Further when the environment magnetic field is approximately 0, the resistance values of the first magnetic field detection element 10 and the second magnetic field detection element 20 are preferably equal, and the resistance values of the second magnetic field detection element 20 and the sixth to the eighth magnetic field detection elements (not shown) are preferably equal.

As shown in the prior art, in the embodiment that the difference of the outputs of each magnetic field detection part is obtained through operation in order to reduce the influence of the environment magnetic field, it needs two differential operation parts to output the output of the magnetic field detection part corresponding to the first and the second magnetic field detection elements (10, 20), and a differential operation part to output the difference of the outputs of the differential operation part is needed. On the other hand, in the present embodiment 1, since the same function can be obtain only by the first differential operation part 210 included in the first magnetic field detection part 410, the parts number of the differential operation part can be decreased and miniaturization can be realized. In addition, it is the same even though there is the third differential operation part (not shown). That is, the differential operation part usually to carry out the differential operation between the outputs of the first and the third differential operation parts is not needed in the present embodiment.

Moreover, in the present embodiment 1, when the detection magnetic field is measured, by the output of the first differential operation part 210, in the magnetic field detection part for detecting the environment magnetic field (the first magnetic field detection part 410) and the magnetic field detection part for detecting the magnetic field (the second magnetic field detection part 420), the current feedback loop that applies the first feedback current magnetic field, generated by the first magnetic field generating part 110 with a opposite direction to the environment magnetic field, and the second current magnetic field, generated by the second magnetic field generating part 120, is formed, output variation (temperature drift) of the magnetic field detection part (the second magnetic field detection part 420) for detecting magnetic field caused by the change of the environment temperature can be reduced.

Embodiment 2

Figure 2:
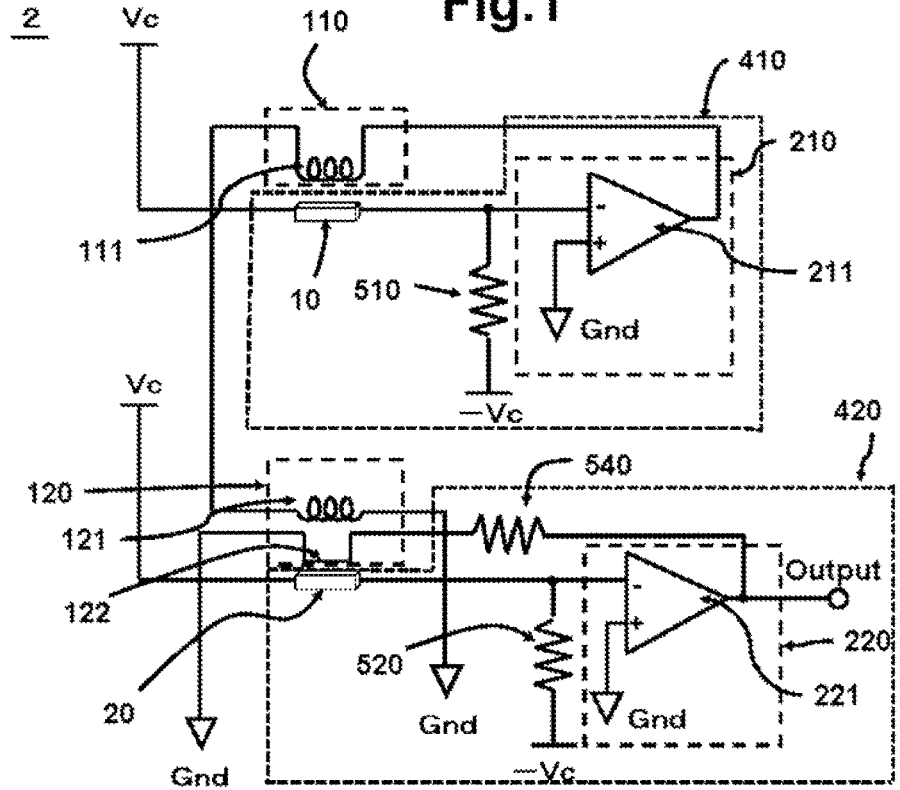
FIG. 2 is a schematic drawing of the magnetic field detection device of the embodiment 2.

FIG. 2 is a brief drawing of the magnetic field detection device 2 of the present embodiment 2. The magnetic field detection device 2 include the first magnetic field generating conductor 111 which is contained in the first magnetic field generating part 110, the first magnetic field detection element 10, the first differential operation circuit 211 which is contained in the first differential operation part 210, the first resistance 510, the second magnetic field generating conductor 121 which is contained in the second magnetic field generating part 120, the third magnetic field generating conductor 122, the second magnetic field detection element 20, the fourth differential operation circuit 221 included in the second differential operation part 220, the second resistance 520, and the detection resistance 540. Here, the first magnetic field detection part 410 consists of the first magnetic field detection element 10, the first differential operation part 210 and the first resistance 510, and the second magnetic field detection part 420 consists of the second magnetic field detection element 20, the second differential operation part 220, the second resistance 520, and the detection resistance 540. The connection relation is shown as follows.

One end of the first magnetic field generating conductor 111 contained in the first magnetic field generating part 110 is connected with the output end of the first differential operation circuit 211 included in the first differential operation part 210. One input end of a pair of input ends of the first differential operation circuit 211 is connected with the other end of the first magnetic field detection element 10, one end of which is connected to the first potential (Vc). The other input end of a pair input ends of the first differential operation circuit 211 is connected with the third potential (Gnd). The other end of the first magnetic field detection element 10 is connected with the other end of the first resistance 510, one end of which is connected to the second potential (−Vc). The other end of the first magnetic field generating conductor 111 is connected with one end of the second magnetic field generating conductor 121 included in the second magnetic field generating part 120. The other end of the second magnetic field generating conductor 121 is connected to the third potential (Gnd). The other end of the second magnetic field detection element 20, one end of which is connected to the first potential (Vc), is connected with one input end of a pair of input ends of the fourth differential operation circuit 221 included in the second differential operation part 220. The other input end of a pair input ends of the fourth differential operation circuit 221 is connected to the third potential (Gnd). One end of the second resistance 520 is connected to the second potential (−Vc) and the other end is connected to the other end of the second magnetic field detection element 20. The output end of the fourth differential operation circuit 221 is connected to one end of the detection resistance 540. The other end of the detection resistance 540 is connected to one end of the third magnetic field generating conductor 122. The other end of the third magnetic field generating conductor 122 is connected to the third potential (Gnd). Here, the other end of the first magnetic field detection element 10 outputs the first output, and the other end of the second magnetic field detection element 20 outputs the second output. The difference between the embodiment 2 and the embodiment 1 lies in that the second magnetic field detection part 420 includes the second differential operation part 220, the second magnetic field generating part 120 includes the third magnetic field generating conductor 122, and the current feedback loop is formed relative to the detection magnetic field measured by the second magnetic field detection part 420. As the other structure is the same as embodiment 1, the second magnetic field generating part 120 and the second magnetic field detection part 420 are described as follows and the description of the same structure as that in embodiment 1 is omitted.

The second magnetic field detection part 420 has the second differential operation part 220, and the second differential operation part 220 includes the fourth differential operation circuit 221. Here, the second output i.e., the output of the second magnetic field detection element 20 is inputted into one input end of a pair of input ends of the fourth differential operation circuit 221 and the other input end is connected to the third potential (Gnd). Further, when there is the sixth magnetic field detection element (not shown), the connection end, connecting the other end of the sixth magnetic field detection element (not shown) with the other end of the third resistance (not shown) (one end of which is connected to the second potential (−Vc)), also can be connected to the other input end of the fourth differential operation circuit 221. In addition, the second output i.e. the output of the second magnetic field detection element 20 is inputted into one input end of a pair of input ends of the fourth differential operation circuit 221, and the other input end is connected to the third potential (Gnd). One input end of a pair input ends of the fifth differential operation circuit (not shown) is connected to the connection end connecting the other end of the sixth magnetic field detection element (not shown) and the other end of the third resistance (not shown), one end of which is connected to the second potential (−Vc). And the other input end is connected to the third potential (Gnd). The outputs of the fourth differential operation circuit 221 and the fifth differential operation circuit (not shown) respectively input into a pair of input ends of the sixth differential operation circuit (not shown), and the output end of the sixth differential operation circuit (not shown) also can be connected to one end of the detection resistance 540. Further, the signs of the change rates of the resistance values of the second magnetic field detection element 20 (applied with environment magnetic field) and the sixth magnetic field detection element (not shown) are preferably different. By make the signs of the change rates of resistance values different, the output of the second differential operation part 220 can be increased and detection accuracy of environment magnetic field can be improved.

As shown in FIG. 2, one end of the third magnetic field generating conductor 122 included in the second magnetic field generating part 120 is connected to the other end of the detection resistance 540, one end of which is connected to the output end of the second differential operation part 220. The second feedback current flows into the detection resistance 540. Therefore, the output corresponding to the detection magnetic field can be obtained from one end of the detection resistance 540. In addition, the following structure can be formed, in which the output end of the second differential operation part 220 is connected to the control end of the third field-effect transistor (not shown), a non-control end of which is connected to the first potential (Vc), and one end of the detection resistance 540 is connected to the other non-control end of the third field-effect transistor (not shown). In this case, the output from the output end of the second differential operation part 220 controls the control end of the third field-effect transistor (not shown), and the current flowing to the detection resistance 540 connecting to the other end of the non-control end (which responds to the signal of the control end) becomes the second feedback current. In addition, a bipolar transistor, a static induction transistor or the like can be used to replace the third field-effect transistor (not shown). Further, the structure, in which the first feedback current and the second current flows into the different conductor respectively, also can be formed. In the case of connecting one end of the first magnetic field generating conductor 11 with the other end of the second magnetic field generating conductor 121 (one end of which is connected to Gnd) through a conductor, the first feedback current and the second current can become equal.

In addition, one end of the detection resistance 540 is connected to one end of the third magnetic field generating conductor included in the second magnetic field generating part 120, and thus by means that the second feedback current flows from the output end of the second differential operation part 220 to the third magnetic field generating conductor 122 included in the second magnetic field generating part 120, the second magnetic field generating part 120 generates the second feedback current magnetic field with a opposite direction to the detection magnetic field to reduce the detection magnetic field. Here, the opposite direction relative to the detection magnetic field refers to the magnetic field direction with different sign to reduce the detection amount (corresponding to the detection magnetic field) of the second magnetic field detection element 20. In addition, the magnetic field detection element except the second magnetic field detection element 20 included in the second magnetic field detection part 420 also can be applied. That is, the second differential operation part 220 operates in the way that the second feedback current flows into the third magnetic field generating conductor 122. Therefore, the second magnetic field generating part 120 generates the second current magnetic field responding to the second current that flows into the second magnetic field generating conductor 121, and the second feedback current magnetic field corresponding to the second feedback current that flows into the third magnetic field generating conductor 122. Hence, the second feedback current magnetic field corresponding to the second feedback current with a opposite direction to the detection magnetic field and the second current magnetic field corresponding to the first feedback current with a opposite direction to the environment magnetic field are given to the second magnetic field detection element 20, and the second feedback current is used to reduce the detection magnetic field and the first feedback current is used to reduce the environment magnetic field.

Further, the other end of the detection resistance 540 also can be connected to one end of the second magnetic field generating conductor 121 in order to make the second current and the second feedback current flow into the second magnetic field generating conductor 121. In this case, the magnetic field corresponding to the second feedback current and the second current flowing into the second magnetic field generating conductor 121 is generated. Thus, the number of parts can be decreased. Moreover, if the first magnetic field generating conductor 111 is solenoid-shaped, the second magnetic field generating conductor 121 can be produced to be the same shape as the first magnetic field generating conductor 111. In addition, the same material can be used for the first magnetic field generating conductor 111 and the second magnetic field generating conductor 121, and thus the third magnetic field generating conductor 122 is not needed, and dependence of the temperature coefficient can be further reduced. Moreover, since interaction between the magnetic fields generated by the second magnetic field generating conductor 121 and the third magnetic field generating conductor 122 do not need to be considered, area of the detection magnetic field can be broadened.

Further, the second potential is described as -Vc, and the third potential is described as Gnd, and they are not limited to this. And the second potential can be regarded as Gnd and the third potential can be regarded as Vc/2.

Thus, in the present embodiment 2, when the detection magnetic field or the environment magnetic field is measured, the magnetic fields corresponding to the second feedback current and the second current are applied to the second magnetic field detection part 420. Therefore, as the second feedback current (used to reduce the detection magnetic field) corresponding to the output of the second differential operation part 220 flows into the second magnetic field generating 120 to form the current feedback loop, the change of the resistance of the second magnetic field detection element 20 included in the second magnetic field detection part 420 (i.e., ΔR) is controlled in the way of being 0 relative to the detection magnetic field, and thus compared to embodiment 1, output fluctuation (temperature drift) relative to the detection magnetic field of the second magnetic field detection part 420 caused by the environment temperature can be inhibited while the detection magnetic field can be measured. In addition, by forming the current feedback loop, the work area of the second magnetic field detection element 20 included in the second magnetic field detection part 420 is restricted. As the fluctuation of the resistance change ΔR caused by the temperature is inhibited, the linearity of the output of the second magnetic field detection part 420 can also be improved.

Example 1

Figure 4:
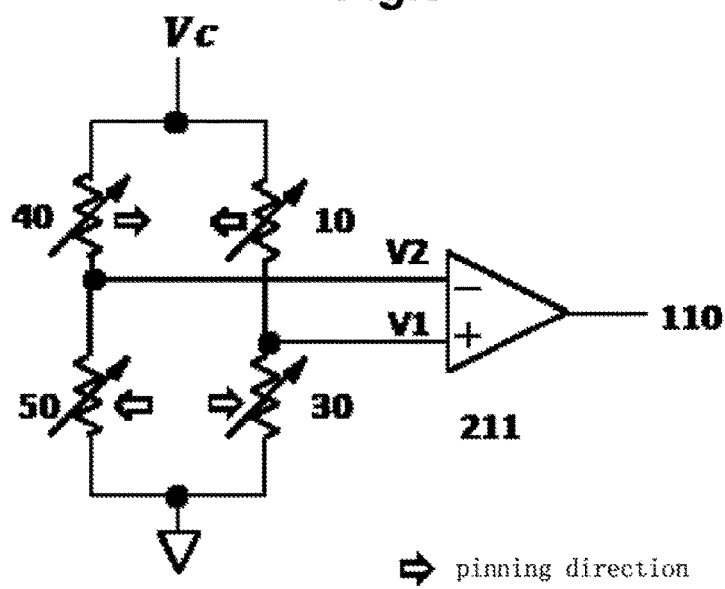
FIG. 4 is a structure drawing of the first magnetic field detection part of Example 1.

FIG. 4 was a structure drawing of the first magnetic field detection part 410 of Example 1. The magnetic field detection part 410 included the first differential operation circuit 211, the first magnetoresistance element 10, and the third to the fifth magnetoresistance elements (30, 40, 50). Here, the first magnetoresistance element 10 and the third to the fifth magnetoresistance elements (30, 40, 50) were S-V huge magnetoresistance element, and the structure laminated with a free layer, a conductive layer and a pinning layer was formed on the substrate. One end of the first magnetoresistance element 10 was connected to the first potential (Vc), the other end of the first magnetoresistance element 10 was connected to the other end of the third magnetoresistance element 30, and one end of the third magnetoresistance element 30 was connected to the third potential (Gnd). One end of the fourth magnetoresistance element 40 was connected to the first potential (Vc), the other end of the fourth magnetoresistance element 40 was connected to the other end of the fifth magnetoresistance element 50, and one end of the fifth magnetoresistance element 50 was connected to the third potential (Gnd). Here, the first magnetoresistance element 10 and the third to the fifth magnetoresistance element (30, 40, 50) were placed in the same plane, they were placed in the way that the longitudinal direction of the first magnetoresistance element 10 was at the same line as that of the third magnetoresistance element 30, and they were placed in the way that the longitudinal direction of the fourth magnetoresistance element 40 was at the same line as that of the fifth magnetoresistance element 50. The pinning direction of each pinning layer that was included in the first magnetoresistance element 10, and the third to the fifth magnetoresistance element (30, 40, 50) was vertical to the longitudinal direction. The pinning direction of the third magnetoresistance element 30 was opposite to that of the first magnetoresistance element 10, and the pinning direction of the fifth magnetoresistance element 50 was opposite to that of the fourth magnetoresistance element 40. In addition, the pinning direction of the first magnetoresistance element 10 and the fifth magnetoresistance element 50 (diagonally disposed) was the same as that of the third magnetoresistance element 30 and the fourth magnetoresistance element 40 (diagonally disposed). Besides, the first magnetoresistance element 10 and the third magnetoresistance element 30, as well as the fourth magnetoresistance element 40 and the fifth magnetoresistance element 50 were parallelly placed. By disposing the first magnetoresistance element 10 and the third to the fifth magnetoresistance elements (30, 40, 50) in this way, the connection potential (V1) of the first magnetoresistance element 10 and the third magnetoresistance element 30 changed relative to the environment magnetic field in some direction, and the connection potential (V2) of the fourth magnetoresistance element 40 and the fifth magnetoresistance element 50 changed in opposite polarity to the connection potential (V1) of the first magnetoresistance element 10 and the third magnetoresistance element 30. Thus, the difference of the input potential of the first differential operation circuit 211 could be increased. That is, accuracy of the output of the first differential operation circuit 211 corresponding to the environment magnetic field might be improved.

Figure 5:
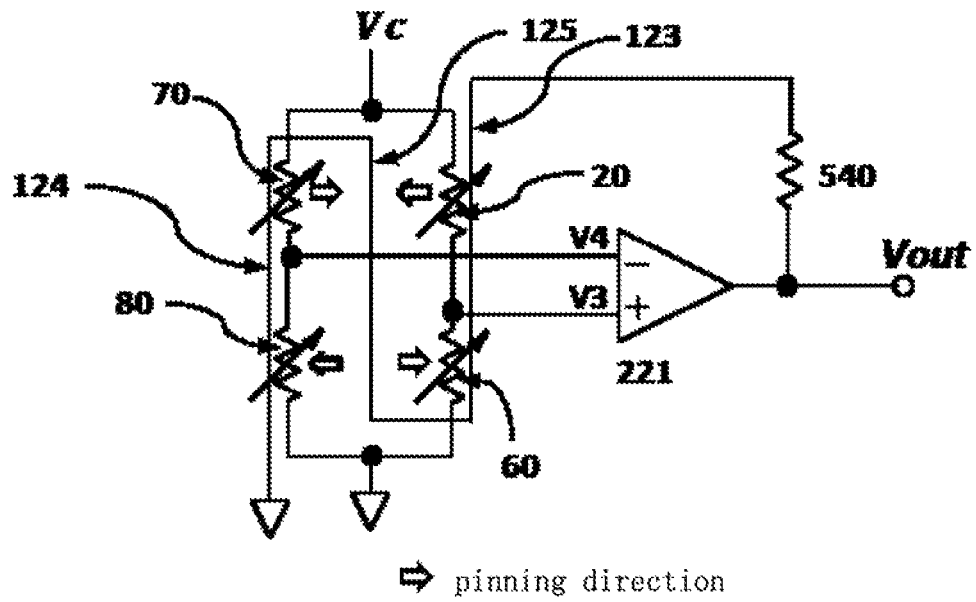
FIG. 5 is a structure drawing of the second magnetic field detection part and the third magnetic field generating conductor that is included in the second magnetic field generating part of Example 1.

FIG. 5 was a structure drawing of the second magnetic field generating part 420, and the third magnetic field generating conductor 122 that was included in the second magnetic field detection part 120 of Example 1. The second magnetic field detection part 420 contained the fourth differential operation circuit 221, the detection resistance 540, the second resistance element 20, the sixth to the eighth magnetoresistance elements (60, 70, 80). Here, the second magnetoresistance element 20 and the sixth to the eighth magnetoresistance elements (60, 70, 80) were S-V huge magnetoresistance element, and the structure laminated with a free layer, a conductive layer and a pinning layer was formed on the substrate. In addition, a insulation film was formed on the second magnetoresistance element 20 and the sixth to the eighth magnetoresistance elements (60, 70, 80), and on the upper portion of the insulation film the third magnetic field generating conductor 122 was integrally formed with the insulation film. One end of the second magnetoresistance element 20 was connected to the first potential (Vc), the other end of the second magnetoresistance element 20 was connected to the other end of the sixth magnetoresistance element 60, and one end of the sixth magnetoresistance element 60 was connected to the third potential (Gnd). One end of the seventh magnetoresistance element 70 was connected to the first potential (Vc), the other end of the seventh magnetoresistance element 70 was connected to the other end of the eighth magnetoresistance element 80, and one end of the eighth magnetoresistance element 80 was connected to the third potential (Gnd). Here, the second magnetoresistance element 20 and the sixth to the eighth magnetoresistance element (60, 70, 80) were disposed in the same plane, they were placed in the way that the longitudinal direction of the second magnetoresistance element 20 was at the same line as that of the sixth magnetoresistance element 60, and they were placed in the way that the longitudinal direction of the seventh magnetoresistance element 70 was at the same line as that of the eighth magnetoresistance element 80. The pinning direction of each pinning layer that was included in the second magnetoresistance element 20, and the sixth to the eighth magnetoresistance element (60, 70, 80) was vertical to the longitudinal direction. The pinning direction of the sixth magnetoresistance element 60 was opposite to that of the second magnetoresistance element 20, and the pinning direction of the eighth magnetoresistance element 80 was opposite to that of the seventh magnetoresistance element 70. In addition, the pinning direction of the second magnetoresistance element 20 and the eighth magnetoresistance element 80 (diagonally disposed) was the same as that of the sixth magnetoresistance element 60 and the seventh magnetoresistance element 70 (diagonally disposed). Besides, the second magnetoresistance element 20 and the sixth magnetoresistance element 60, as well as the seventh magnetoresistance element 70 and the eighth magnetoresistance element 80 were parallelly placed. The third magnetic field generating conductor 122 was disposed in the way that the upper portion of the second magnetoresistance element 20 and the sixth magnetoresistance element 60 became the first conductor part 123 on the same line, and the upper portion of the seventh magnetoresistance element 70 and the eighth magnetoresistance element 80 became the second conductor part 124 on the same line. And the third magnetic field generating conductor 122 was disposed in the way that the magnetic field with a opposite direction to the detection magnetic field was applied to the second magnetoresistance element 20, and the sixth to the eighth magnetoresistance element (60, 70, 80). Here, the straight-shaped third conductor part 125 was parallel to the first and the second conductor part (123, 124) on the central of the first and the second conductor part (123, 124) disposed in the parallel way with the same material, line width and length. Moreover, one ends of the first and the third conductor parts (123, 125) at the first direction were connected with each other, and the other ends of the second and the third conducting wire parts (124, 125) with a opposite direction to the first direction were connected with each other. By disposing the second magnetoresistance element 20 and the sixth to the eighth magnetoresistance elements (60, 70, 80) in this way, the connection potential (V3) of the second magnetoresistance element 20 and the sixth magnetoresistance element 60 changed relative to the detection magnetic field, and the connection potential (V4) of the seventh magnetoresistance element 70 and the eighth magnetoresistance element 80 changed in opposite polarity to the connection potential (V3) of the second magnetoresistance element 20 and the sixth magnetoresistance element 60. Thus, the difference of the input potential of the fourth differential operation circuit 221 could be increased. That is, accuracy of the output of the fourth differential operation circuit 221 corresponding to the detection magnetic field might be improved. Further, the output end of the fourth differential operation circuit 221 was connected to the other end of the detection resistance 540, one end of which was connected to the other end of the first conductor part 123 of the third magnetic field generating conductor 122. One end of the second conductor part 124 of the third magnetic field generating conductor 122 was connected to the third potential (Gnd).

Figure 6:
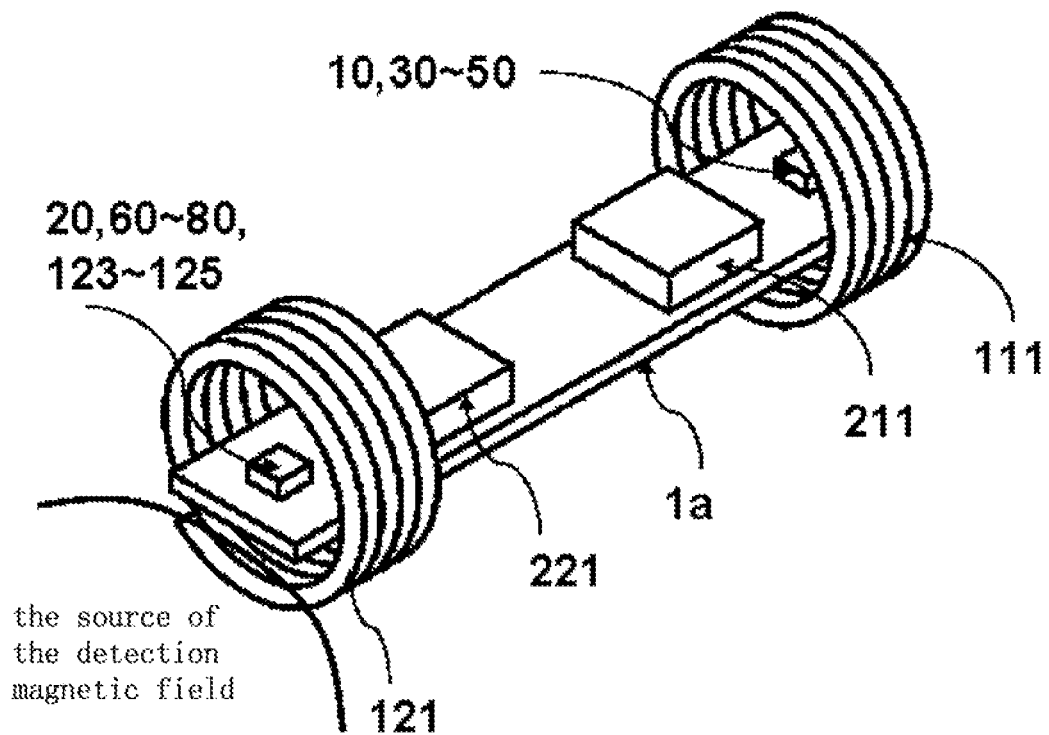
FIG. 6 is a structure drawing of the magnetic field detection device of Example 1.

FIG. 6 was a structure drawing of the magnetic field detection device 3 of Example 1. The first magnetic field detection part 410 included the first differential operation circuit 211 as shown in FIG. 4, the second magnetic field detection part 420 with the fourth differential operation circuit 221 as shown in FIG. 5, and the third magnetic field generating conductor 122 included in the second magnetic field generating part 120 was mounted on the mounting substrate a1. Here, the first magnetic field generating conductor 111 was disposed separately from the first magnetoresistance element 10 and the third to the fifth magnetoresistance elements (30, 40, 50), and it was the first solenoid coil disposed in the way of surrounding the first magnetoresistance element 10 and the third to the fifth magnetoresistance elements (30, 40, 50). The second magnetic field generating conductor 121 was disposed separately from the second magnetoresistance element 20 and the sixth to the eighth magnetoresistance elements (60, 70, 80), and it was the second solenoid coil disposed in the way of surrounding the second magnetoresistance element 20 and the sixth to the eighth magnetoresistance elements (60, 70, 80). Further, the first and the second solenoid coils were the solenoid coil with the same turn number, winding direction, material, width and length. In addition, the first and the second solenoid coils were respectively disposed on the side of both ends of the mounting substrate a1, and they were disposed in the way of their center line being parallel. The center line refers to a straight line extending the center of the solenoid coil when the solenoid coil was observed from longitudinal direction. The first magnetic field generating conductor 111 included in the first magnetic field generating part 110 was disposed in the way of applying the first feedback current magnetic field with a opposite direction to the environment magnetic field to the first magnetoresistance element 10 and the third to the fifth magnetoresistance elements (30, 40, 50). The second magnetic field generating conductor 121 included in the second magnetic field generating part 120 was disposed in the way of applying the second current magnetic field with a opposite direction to the environment magnetic field to the second magnetoresistance element 20 and the sixth to the eighth magnetoresistance elements (60, 70, 80). One end of the first magnetic field generating conductor 111 was connected to the output end of the first differential operation circuit 211, the other end of the first magnetic field generating conductor 111 was connected to one end of the second magnetic field generating conductor 121, and the other end of the second magnetic field generating conductor 121 was connected to the third potential (Gnd). Therefore, the first feedback current flowing into the first magnetic field generating conductor 111 was the same as the second current flowing into the second magnetic field generating conductor 121. Here, since the winding direction of the first and the second solenoid coils was the same, the direction of the first feedback current magnetic field at the center line of the first solenoid coil was the same as that of the second current magnetic field at the center line of the second solenoid coil.

As stated above, the first magnetic field generating conductor 111 and the second magnetic field generating conductor 121 were solenoid-shaped coils. The first magnetoresistance element 10 and the third to the fifth magnetoresistance elements (30, 40, 50), disposed separately from the first magnetic field generating conductor 111, were disposed in the inside of the first magnetic field generating conductor 111, i.e., the inside of the first solenoid coil. The second magnetoresistance element 20 and the sixth to the eighth magnetoresistance elements (60, 70, 80), disposed separately from the second magnetic field generating conductor 121, were disposed in the inside of the second magnetic field generating conductor 121, i.e., the inside of the second solenoid coil. Moreover, the first magnetoresistance element 10 and the third to the fifth magnetoresistance elements (30, 40, 50) were preferably disposed with the same distance from the center of the first magnetic field generating conductor 111, i.e., the center line of the first solenoid coil. The first magnetoresistance element 10 and the third magnetoresistance element 30 were axisymmetric with the fourth magnetoresistance element 40 and the fifth magnetoresistance element 50 relative to the first straight line (not shown) passing through the first magnetic field generating conductor 111, i.e., the center of the first solenoid coil. And, the first magnetoresistance element 10 and the fourth magnetoresistance element 40 were axisymmetric with the third magnetoresistance element 30 and the fifth magnetoresistance element 50 relative to the second straight line (not shown) that was vertical to the first straight line (not shown) passing through the first magnetic field generating conductor 111, i.e., the center of the first solenoid coil. The second magnetoresistance element 20 and the sixth to the eighth magnetoresistance elements (60, 70, 80) were preferably disposed with the same distance from the center of the second magnetic field generating conductor 121, i.e., the center line of the second solenoid coil. The second magnetoresistance element 20 and the sixth magnetoresistance element 60 were axisymmetric with the seventh magnetoresistance element 70 and the eighth magnetoresistance element 80 relative to the third straight line (not shown) passing through the center of the second magnetic field generating conductor 121, i.e. the second solenoid coil. And, the second magnetoresistance element 20 and the seventh magnetoresistance element 70 were axisymmetric with the sixth magnetoresistance element 60 and the eighth magnetoresistance element 80 relative to the fourth straight line (not shown) that was vertical to the third straight line (not shown) passing through the center of the second magnetic field generating conductor 121, i.e. the second solenoid coil. In addition, the surface with the first magnetoresistance element 10 and the third to the fifth magnetoresistance elements (30, 40, 50) disposed and the surface with the second magnetoresistance element 20 and the sixth to the eighth magnetoresistance elements (60, 70, 80) disposed were parallel in the way of making the longitudinal direction of the first to the eighth magnetoresistance elements (10~80) towards the same direction. Further, in the present Example 1, the second straight line was roughly consistent with the center line passing through the center of the first solenoid coil, and the fourth straight line was roughly consistent with the center line passing through the center of the second solenoid coil. By disposing in this way, the resistance of the first to the eighth magnetoresistance elements (10~80), relative to the magnetic field vertical to the longitudinal direction, changed. And thus, the output of each bridge circuit as shown in FIGS. 4 and 5 could be increased relative to the same magnetic field. In addition, as the first and the second solenoid coils were disposed respectively, the design would be easy compared to the integral of solenoid coils. Further, compared to the integral of solenoid coils, miniaturization of coils could come true.

If the environment magnetic field was detected by the first magnetic field detection part 410, the potential difference was generated between the connection potential (V1) (of the first magnetoresistance element 10 and the third magnetoresistance element 30) and the connection potential (V2) (of the fourth magnetoresistance element 40 and the fifth magnetoresistance element 50). Then, the differential operation circuit 211 makes output corresponding to the potential difference, i.e. the first feedback current flow into the first magnetic field generating conductor 111, and generates the magnetic field (with a opposite direction to the environment magnetic field) in order that the environment magnetic field decreases. As a result, the potential difference of a pair of input ends of the first differential operation circuit 211 became 0, and the first feedback current corresponding to the environment magnetic field flowed in the second magnetic field generating conductor 121 as the second current.

Since it was considered that the environment magnetic field which affects the first magnetic field detection part 410 and the second magnetic field detection part 420 was approximately uniform, the environment magnetic field was decreased by the magnetic field generated by the second current in the second magnetic field generating conductor 121. Thus, the detection magnetic field could be measured by the second magnetoresistance element 20 and the sixth to the eighth magnetoresistance elements (60, 70, 80) on the condition of the environment magnetic field being reduced.

If the environment magnetic field was detected by the second magnetic field detection part 420, the potential difference was generated between the connection potential (V3) (of the second magnetoresistance element 20 and the sixth magnetoresistance element 60) and the connection potential (V4) (of the seventh magnetoresistance element 70 and the eighth magnetoresistance element 80). Then, the fourth differential operation circuit 221 make the second feedback current flow into the detection resistance 540 and the third magnetic field generating conductor 122 in order that the potential difference is 0, and the third magnetic field generating conductor 122 generate the magnetic field with a opposite direction to the detection magnetic field in order to decrease the detection magnetic field.

Therefore, the potential difference of a pair of input ends of the fourth differential operation circuit 221 was 0, and the second feedback corresponding to the detection magnetic field could be measured as the voltage value at the connection point of the detection resistance 540 and the fourth differential operation circuit 221.

The output of the first differential operation circuit 211 relative to the first magnetic field generating conductor 111 formed the current feedback loop, in which the current flowed to generate magnetic field used to reduce the environment magnetic field. Thus, the resistance changes ΔR of the magnetoresistance elements (10, 30, 40, 50) included in the first magnetic field detection part 410 were controlled in the way of the output of the first differential operation circuit 211 being 0 relative to the environment magnetic field. As a result, output fluctuation of the resistance changes ΔR caused by temperature (temperature drift) could be inhibited. In addition, as the current with the equal value also flowed into the second magnetic field generating conductor 121, the second current magnetic field (which was used to reduce environment magnetic field) generated by the second magnetic field generating conductor 121 also would inhibit output fluctuation of the resistance changes ΔR of the magnetoresistance elements (20, 60, 70, 80) included in the second magnetic field detection part 420 caused by temperature (temperature drift). That is, the output of the fourth differential operation circuit 221 could detect the detection magnetic field on the condition of inhibiting output fluctuation (temperature drift) of the resistance changes ΔR of the magnetoresistance elements in the environment magnetic field caused by temperature. In addition, the current feedback loop, in which the second feedback current flowed into the third magnetic field generating conductor 122, also was formed in the detection magnetic field, and thus output fluctuation (temperature drift) of the resistance changes ΔR of the magnetoresistance elements (20, 60, 70, 80) included in the second magnetic field detection part 420 caused by temperature could be inhibited.

Since the environment magnetic field was reduced by the magnetic field generated by the second current in the second magnetic field generating conductor 121, the detection magnetic field could be measured by the second magnetoresistance element 20 and the sixth to the eighth magnetoresistance elements (60, 70, 80) on the condition of environment magnetic field being reduced. Thus, the operation circuit used to remove the environment magnetic field was not needed. Hence, the parts number could be reduced and miniaturization could be realized.

The magnetic field detection device according to the present invention can be applied in magnetic field detection apparatus which detects a weak magnetic field and etc., measurement equipment, electrical equipment and the like using the magnetic field detection device.

DESCRIPTION OF REFERENCE NUMERALS 1, 2, 3 Magnetic field detection device
1a Mounting substrate
10, 20 Magnetic field detection element
110, 120 Magnetic field generating part
111, 121, 122 Magnetic field generating conductor
123, 124, 125 Conductor part
210, 220 Differential operation part
211, 221 Differential operation circuit
410, 420 Magnetic field detection part
510, 520 Resistance
530, 540 Detection resistance

What is claimed is:
1. A magnetic field detection device comprising:
a first magnetic field generating part, comprising a first magnetic field generating conductor;
a first magnetic field detection part, comprising a first magnetic field detection element and a first differential operation part, the first magnetic field detection element having a first end and a second end, the first end being connected to a fixed voltage representing an external magnetic field that is not generated by the first magnetic field generating part, the second end being connected to an input of the first differential operation part, wherein
a first output of said first magnetic field detection element corresponding to the external magnetic field is inputted into said first differential operation part, and a first feedback current flows into said first magnetic field generating conductor, and thus said first magnetic field generating part provides said first magnetic field detection element with a first feedback current magnetic field, with a direction opposite to said external magnetic field;
a second magnetic field generating part, comprising a second magnetic field generating conductor, in which a second current corresponding to said first feedback current flows; and
a second magnetic field detection part, comprising a second magnetic field detection element, the second magnetic field detection element having a third end and a fourth end, the third end being connected to the fixed voltage, and the fourth end not being connected to the input of the first differential operation part,
wherein said second magnetic field generating part provides said second magnetic field detection element with a magnetic field corresponding to said second current, with a direction opposite to said external magnetic field, and
a detection magnetic field is detected by said second magnetic field detection part.
2. The magnetic field detection device according to claim 1, wherein
the magnetic field generated by said first magnetic field generating conductor is parallel to that generated by said second magnetic field generating conductor,
wherein, said first magnetic field detection element is disposed in parallel with said second magnetic field detection element.
3. The magnetic field detection device according to claim 1, wherein,
said first magnetic field generating conductor is a first solenoid coil which is disposed separately from said first magnetic field detection element,
wherein, said second magnetic field generating conductor is a second solenoid coil which is disposed separately from said second magnetic field detection element,
wherein, said first magnetic field detection element is disposed in the inside of said first solenoid coil,
wherein, said second magnetic field detection element is disposed in the inside of said second solenoid coil,
wherein, said first magnetic field detection element is disposed in parallel with said second magnetic field detection element, and the center line of said first solenoid coil is parallel to that of said second solenoid coil.

4. The magnetic field detection device according to claim 1, wherein
said second magnetic field generating part comprises a third magnetic field generating conductor, wherein,
said second magnetic field detection part comprises a second differential operation part, wherein a second output of said second magnetic field detection element corresponding to said detection magnetic field is inputted into said second differential operation part, and a second feedback current flows into said second magnetic field generating part, and thus said second magnetic field generating part provides said second magnetic field detection element with a magnetic field, with a direction opposite to said detection magnetic field,
wherein, said second magnetic field generating part generates a second current magnetic field and a second feedback current magnetic field, wherein said second current magnetic field is corresponding to said second current that flows in said second magnetic field generating conductor, and said second feedback current magnetic field is corresponding to said second feedback current that flows in said third magnetic field generating conductor.

5. The magnetic field detection device according to claim 1, wherein said second magnetic field detection part comprises a second differential operation part, wherein a second output of said second magnetic field detection element corresponding to said detection magnetic field is inputted into said second differential operation part, and a second feedback current flows into said second magnetic field generating part, and thus said second magnetic field generating part providing said second magnetic field detection element with a magnetic field, with a direction opposite to said detection magnetic field,
wherein, said second magnetic field generating part generates magnetic fields that are corresponding to said second current and said second feedback current, in which said second current flows in said second magnetic field generating conductor.

6. The magnetic field detection device according to claim 1, wherein said first magnetic field detection element and said second magnetic field detection element are magnetoresistance elements.

7. The magnetic field detection device according to claim 2, wherein
said second magnetic field generating part comprises a third magnetic field generating conductor, wherein,
said second magnetic field detection part comprises a second differential operation part, wherein a second output of said second magnetic field detection element corresponding to said detection magnetic field is inputted into said second differential operation part, and a second feedback current flows into said second magnetic field generating part, and thus said second magnetic field generating part provides said second magnetic field detection element with a magnetic field, with a direction opposite to said detection magnetic field,
wherein, said second magnetic field generating part generates a second current magnetic field and a second feedback current magnetic field, wherein said second current magnetic field is corresponding to said second current that flows in said second magnetic field generating conductor, and said second feedback current magnetic field is corresponding to said second feedback current that flows in said third magnetic field generating conductor.

8. The magnetic field detection device according to claim 3, wherein
said second magnetic field generating part comprises a third magnetic field generating conductor, wherein,
said second magnetic field detection part comprises a second differential operation part, wherein a second output of said second magnetic field detection element corresponding to said detection magnetic field is inputted into said second differential operation part, and a second feedback current flows into said second magnetic field generating part, and thus said second magnetic field generating part provides said second magnetic field detection element with a magnetic field, with a direction opposite to said detection magnetic field,
wherein, said second magnetic field generating part generates a second current magnetic field and a second feedback current magnetic field, wherein said second current magnetic field is corresponding to said second current that flows in said second magnetic field generating conductor, and said second feedback current magnetic field is corresponding to said second feedback current that flows in said third magnetic field generating conductor.

9. The magnetic field detection device according to claim 2, wherein said second magnetic field detection part comprises a second differential operation part, wherein a second output of said second magnetic field detection element corresponding to said detection magnetic field is inputted into said second differential operation part, and a second feedback current flows into said second magnetic field generating part, and thus said second magnetic field generating part providing said second magnetic field detection element with a magnetic field, with a direction opposite to said detection magnetic field,
wherein, said second magnetic field generating part generates magnetic fields that are corresponding to said second current and said second feedback current, in which said second current flows in said second magnetic field generating conductor.

10. The magnetic field detection device according to claim 3, wherein said second magnetic field detection part comprises a second differential operation part, wherein a second output of said second magnetic field detection element corresponding to said detection magnetic field is inputted into said second differential operation part, and a second feedback current flows into said second magnetic field generating part, and thus said second magnetic field generating part providing said second magnetic field detection element with a magnetic field, with a direction opposite to said detection magnetic field,
wherein, said second magnetic field generating part generates magnetic fields that are corresponding to said second current and said second feedback current, in which said second current flows in said second magnetic field generating conductor.

11. The magnetic field detection device according to claim 2, wherein said first magnetic field detection element and said second magnetic field detection element are magnetoresistance elements.

12. The magnetic field detection device according to claim 3, wherein said first magnetic field detection element and said second magnetic field detection element are magnetoresistance elements.

13. The magnetic field detection device according to claim 4, wherein said first magnetic field detection element and said second magnetic field detection element are magnetoresistance elements.

14. The magnetic field detection device according to claim 7, wherein said first magnetic field detection element and said second magnetic field detection element are magnetoresistance elements.

15. The magnetic field detection device according to claim 8, wherein said first magnetic field detection element and said second magnetic field detection element are magnetoresistance elements.

16. The magnetic field detection device according to claim 5, wherein said first magnetic field detection element and said second magnetic field detection element are magnetoresistance elements.

17. The magnetic field detection device according to claim 9, wherein said first magnetic field detection element and said second magnetic field detection element are magnetoresistance elements.

18. The magnetic field detection device according to claim 10, wherein said first magnetic field detection element and said second magnetic field detection element are magnetoresistance elements.

19. The magnetic field detection device according to claim 1, wherein the first differential operation part includes a first differential operation circuit, the first differential operation circuit comprises a first input that is connected to the input of the first differential operation part, and a second input that is connected to a fixed potential, and an end of the second magnetic field generating conductor is connected to the fixed potential.

* * * * *